United States Patent
Gorman et al.

(10) Patent No.: US 7,458,000 B2
(45) Date of Patent: Nov. 25, 2008

(54) AUTOMATIC SHUTDOWN OR THROTTLING OF A BIST STATE MACHINE USING THERMAL FEEDBACK

(75) Inventors: Kevin W. Gorman, Fairfax, VT (US);
Emory D. Keller, Milton, VT (US);
Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 11/278,238

(22) Filed: Mar. 31, 2006

(65) Prior Publication Data
US 2007/0230260 A1    Oct. 4, 2007

(51) Int. Cl.
*G01R 31/28*   (2006.01)
(52) U.S. Cl. ...................................... 714/733; 714/745
(58) Field of Classification Search ................ 713/323; 702/117; 714/30, 733, 724, 741, 745
See application file for complete search history.

(56) References Cited

U.S. PATENT DOCUMENTS

| | | | |
|---|---|---|---|
| 5,715,464 A * | 2/1998 | Crump et al. ............... | 713/323 |
| 5,961,653 A | 10/1999 | Kalter et al. | |
| 6,496,947 B1 * | 12/2002 | Schwarz ..................... | 714/30 |
| 7,103,495 B2 * | 9/2006 | Kiryu ......................... | 702/117 |
| 7,260,758 B1 * | 8/2007 | Agrawal et al. ............. | 714/733 |
| 2006/0064265 A1 * | 3/2006 | Kiryu ......................... | 702/117 |

OTHER PUBLICATIONS

J. Barth, et al., "A 500MHz Multi-Banked Compilable DRAM Macro with Direct Write and Programmable Pipelining," *IEEE Journal of Solid-State Circuits*, vol. 40, pp. 213-222, Jan. 2005.

* cited by examiner

*Primary Examiner*—David Ton
(74) *Attorney, Agent, or Firm*—Scully, Scott, Murphy & Presser, P.C.; Michael J. LeStrange, Esq.

(57) ABSTRACT

A Built-In-Self-Test (BIST) state machine providing BIST testing operations associated with a thermal sensor device(s) located in proximity to the circuit(s) to which BIST testing operations are applied. The thermal sensor device compares the current temperature value sensed to a predetermined temperature threshold and determines whether the predetermined threshold is exceeded. A BIST control element suspends the BIST testing operation in response to meeting or exceeding said predetermined temperature threshold, and initiates resumption of BIST testing operations when the current temperature value normalizes or is reduced. A BIST testing methodology implements steps for mitigating the exceeded temperature threshold condition in response to determining that the predetermined temperature threshold is met or exceeded. These steps include one of: ignoring the BIST results of the suspect circuit(s), or by causing the BIST state machine to enter a wait state and adjusting operating parameters of the suspect circuits while in the wait state.

19 Claims, 7 Drawing Sheets

AUTOMATIC SHUTDOWN OR THROTTLING OF A BIST STATE MACHINE USING THERMAL FEEDBACK

FIELD OF THE INVENTION

The present invention relates generally to built in self-test (BIST) systems for use in semiconductor devices, and more particularly, to a system and method for controlling execution of device BIST testing based on thermal feedback information from the chip.

DESCRIPTION OF THE PRIOR ART

Chip designers are starting to imbed thermal measurement devices in order to be able to control the functional behavior of the chip to avoid thermal runaway, to minimize power consumption, or to be able to keep a section of the chip operating within a certain temperature range.

As chip designs become ever more complex, built-in-self-test (BIST) mechanisms become more prevalent. As such, there is an ever-increasing gap between how a chip is being used functionally and how it is being tested. It is quite conceivable that with disabled functional power-saving methods such as clock gating and voltage islands coupled with structured self-test methods deployed at other than nominal test conditions, the chip, or sections of the chip, may run considerably hotter at the tester than they might perhaps run in the customer's functional environment.

FIG. 1A depicts a plot 10 of the interaction between temperature and BIST test and particularly, the relationship between temperature vs. BIST test time. As shown in FIG. 1A, a BIST test failure results due to the temperature of the testing environment exceeding a pre-determined limit 15 pending to a thermal runaway condition 19. Essentially in FIG. 1A, a first operating BIST test temperature threshold 15 may be exceeded that would indicate potential false fails recorded.

These challenges have already been addressed in the burn-in arena, where various methods are being pursued as a means of curtailing severe device leakage in order to prevent thermal runaway. Particularly, when BIST testing SRAMs or other high power circuits, it is quite conceivable that entire sections of the chip may need to be cordoned-off or ignored during test in order to maintain the local temperature within the operating range for particular memories under test. If the temperature is not maintained properly it may even be necessary to ignore the test results of those memories within the particular section.

More specifically, it is critical to monitor events and criteria that may potentially indicate the likelihood that a BIST test thermal runaway condition could occur. Particularly:

as device background leakage continues to rise (especially at burn-in and dynamic voltage screen corners), as AC BIST methods being developed are such that memories are run much faster during test and therefore switching activity increases, as large amounts of memory on a die are being pursued by system-on-a-chip designers, as power saving architectures which exploit clock gating of memories such that only a small subset of the memories are being used concurrently in the system for functional operations, and, as the temperature across the die may vary dramatically during test. . . .

the very real possibility of the above-mentioned thermal runaway condition becomes more prevalent.

In today's BIST test approaches, the problem becomes particularly acute for embedded memories on a die that are all continually self-tested in parallel at elevated voltage and temperature conditions. As such, embedded memory designs run the risk of temperature limits being reached or exceeded thus rendering such continuous and parallel self-testing of all memories on a die not possible.

It would be desirable to provide a system and method for determining operating chip temperature during BIST testing and dynamically controlling (throttling BIST test activity or shutting down) the BIST test mechanisms according to temperature information fed back to the BIST machine.

SUMMARY OF THE INVENTION

According to the present invention, there is provided a system and method for controlling a BIST (built-in-self-test) state machine utilizing digital feedback from a local, on-chip thermal sensor device. A constant monitoring of the thermal sensor enables the BIST designer to program the BIST to either: a) ignore the results of BIST for memories within a specified proximity of the thermal sensor that has registered a specified upper temperature limit (this works well for pass/fail BIST mode, but not for failing address data collection); or, b) cause the BISTs within a specified proximity of the thermal sensor that has registered a specified upper temperature limit to enter a wait state, whereby the BIST pauses and waits until after the temperature has dropped by a pre-specified amount before continuing.

During a standby "idle" condition, dropping Vdd by a pre-specified amount will significantly reduce background leakage, allowing the temperature to be brought under control, without losing the valid BIST failing address data that has been collected up to this point. During the "idle" condition it may also be necessary to adjust the test conditions to help maintain temperature control upon resuming test, such as reducing the number of memories being tested, reducing the frequency of clocks during test or reducing the length of test.

The BIST test system and method according to the invention may be advantageously employed for system-on-chip (SOC) designs, ASICs including analog and digital circuitry, and memory circuits such as DRAM, register arrays, ROM and SRAM.

DESCRIPTION OF THE PREFERRED EMBODIMENTS

According to the invention, a new BIST test approach is provided to avoid the risk of temperature limits being reached or exceeded, e.g., during the continuous and parallel self-testing of all electronic memories on a die. According to the approach, a BIST test system is provided that includes a temperature sensor for monitoring temperature of the chip under test and, the provision of feedback control for changing/modifying the BIST test activity according to the monitored temperature conditions.

Figure 2:
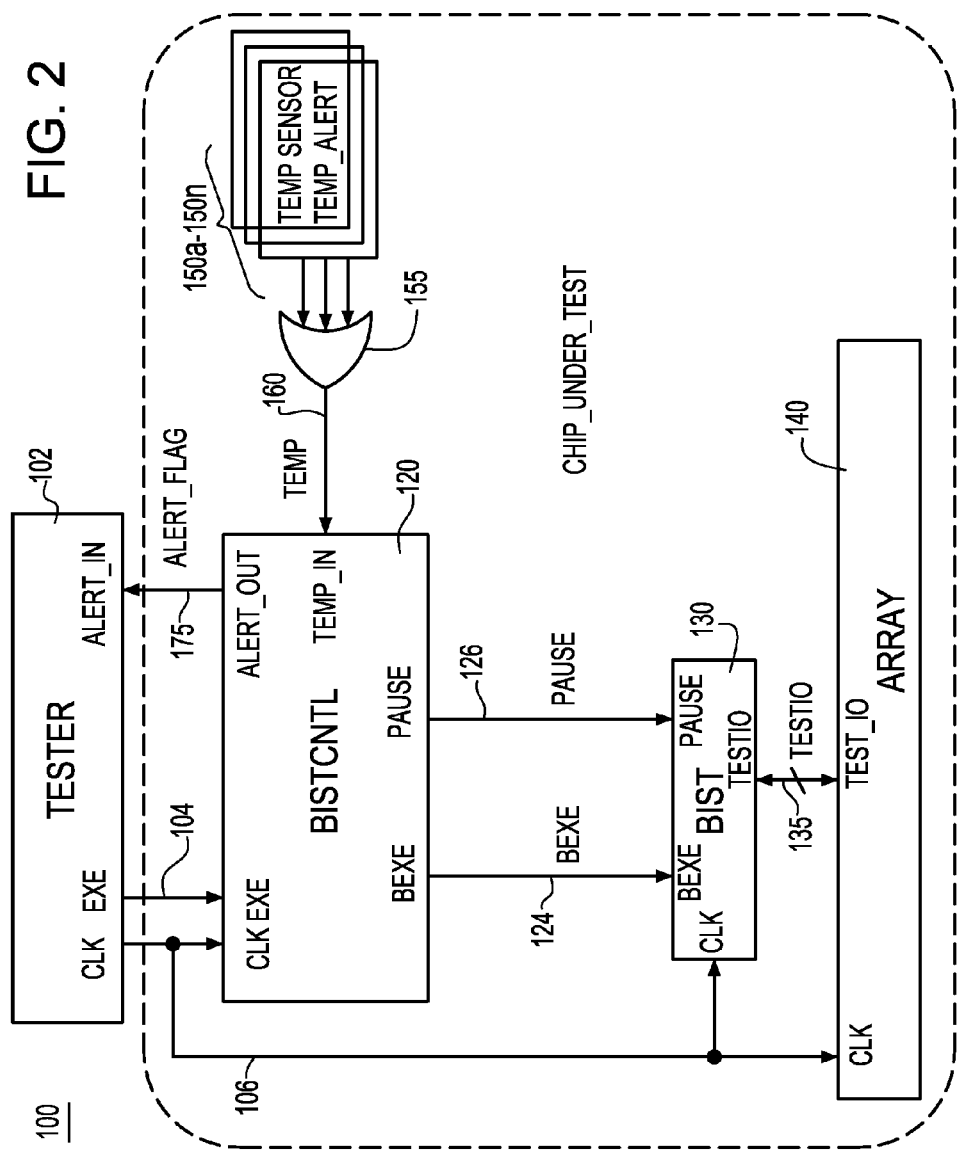
FIG. 2 is a circuit block diagram depicting the BIST and temperature sensor architecture according to the invention.

FIG. 2 illustrates the novel BIST and Temperature Sensor architecture 100 to support temperature sensitive BIST for electronic devices (chip under test) according to the present invention. Representative of an on-chip BIST circuit contemplated for use in the present invention is the processor-based BIST described in U.S. Pat. No. 5,961,653 assigned to the International Business Machines, Inc., the whole contents and disclosure of which is incorporated by reference as if fully set forth herein. Further embodiments of a BIST circuit for use in the present invention is described in the reference to J. Barth, et al., entitled "A 500 MHz Multi-Banked Compilable DRAM Macro with Direct Write and Programmable Pipelining," in IEEE Journal of Solid-State Circuits, vol. 40, pp. 213-222, January 2005, incorporated by reference herein, which describes BIST circuitry physically separated from a DRAM macro. This allows a single BIST engine to test multiple DRAM macros at operating speeds in excess of 500 Mhz at 1.05V and 105° C. The BIST contains sub-blocks including: instruction memory, clock generation circuitry, and pattern generation circuitry with additional functionality according to the invention as now described with reference to FIG. 2.

As shown in FIG. 2, the BIST and Temperature Sensor architecture 100 includes: an off-chip BIST tester 102 that is a processor device including an EXE output signal 104 for respectively initiating BIST test execution and providing a BIST test CLK (clock) signal 106 as is utilized by the BIST test devices implemented in the invention. As will be explained in further detail herein below, the tester 102 further receives an alert signal that is asserted by the on-chip BIST control device 120 to which the BIST tester 102 will respond by initiating or stopping BIST test execution. A BIST control circuit 120 is provided that receives EXE 104 and CLK 106 and includes a TEMP_IN input terminal for receiving a TEMP (temperature) output signal 160 of a logic circuit 155 connected for receiving outputs of a network of temperature sensor devices 150a, . . . , 150n. The BIST control circuit 120 is responsive to the temperature TEMP signal 160 for generating an ALERT_FLAG output signal 175 that is received by an ALERT_IN input terminal of the tester 102. Further responsive to the value of the TEMP signal 160 received, the BIST control circuit 120 further generates a BEXE (begin execution) signal 124 and a PAUSE signal 126 for receipt by the BIST test circuit 130 providing BIST test I/O (TESTIO) signals 135. The memory array 140 receives the TESTIO signals 135 and CLK signals 106 for performing BIST test operations.

As mentioned, there is provided one or more on-chip thermal sensor devices 150a, . . . , 150n that measure temperature at strategic locations of the chip under test, particularly, in proximity to the circuits being tested. Each temperature sensor is fabricated within the chip under test and may be user programmable to trigger once a temperature threshold has been crossed. Generally, such temperature sensors 150a, . . . , 150n include analog circuitry that generates a temperature value and an ADC (analog to digital converter) to produce a digital temperature value. The temperature sensor compares the digital temperature value to a user-programmed maximum value, or, a hard-coded threshold value and produce the ALERT_FLAG if the maximum value is exceeded. Other temperature sensors could use an analog comparison function (rather than digital) to produce the ALERT_FLAG if the maximum value is exceeded. Representative of a typical on-chip thermal sensor device is MAXIM 1464's On-Chip Temperature Sensor (Maxim Integrated Products, Inc.). The outputs of each sensor 150a, . . . , 150n is logically connected to a logic circuit 155 such as an n-input OR gate, or like equivalent. Each thermal sensor device 150a, . . . , 150n is used to determine which circuits, devices or memories (e.g., DRAM) are running or about to run at the high end of the allowed temperature range. Once this information is ascertained, as embodied by TEMP signal 160, the BIST test methodology may be altered according to the methodologies described herein to ameliorate and/or correct the situation. For instance, once a thermal sensor device 150a, . . . , 150n determines that the operating temperature of a circuit meets or exceeds a predetermined threshold limit, the TEMP signal 160 will be asserted and will continue to be asserted as long as the temperature condition threshold is exceeded at that chip location.

Figure 3A:
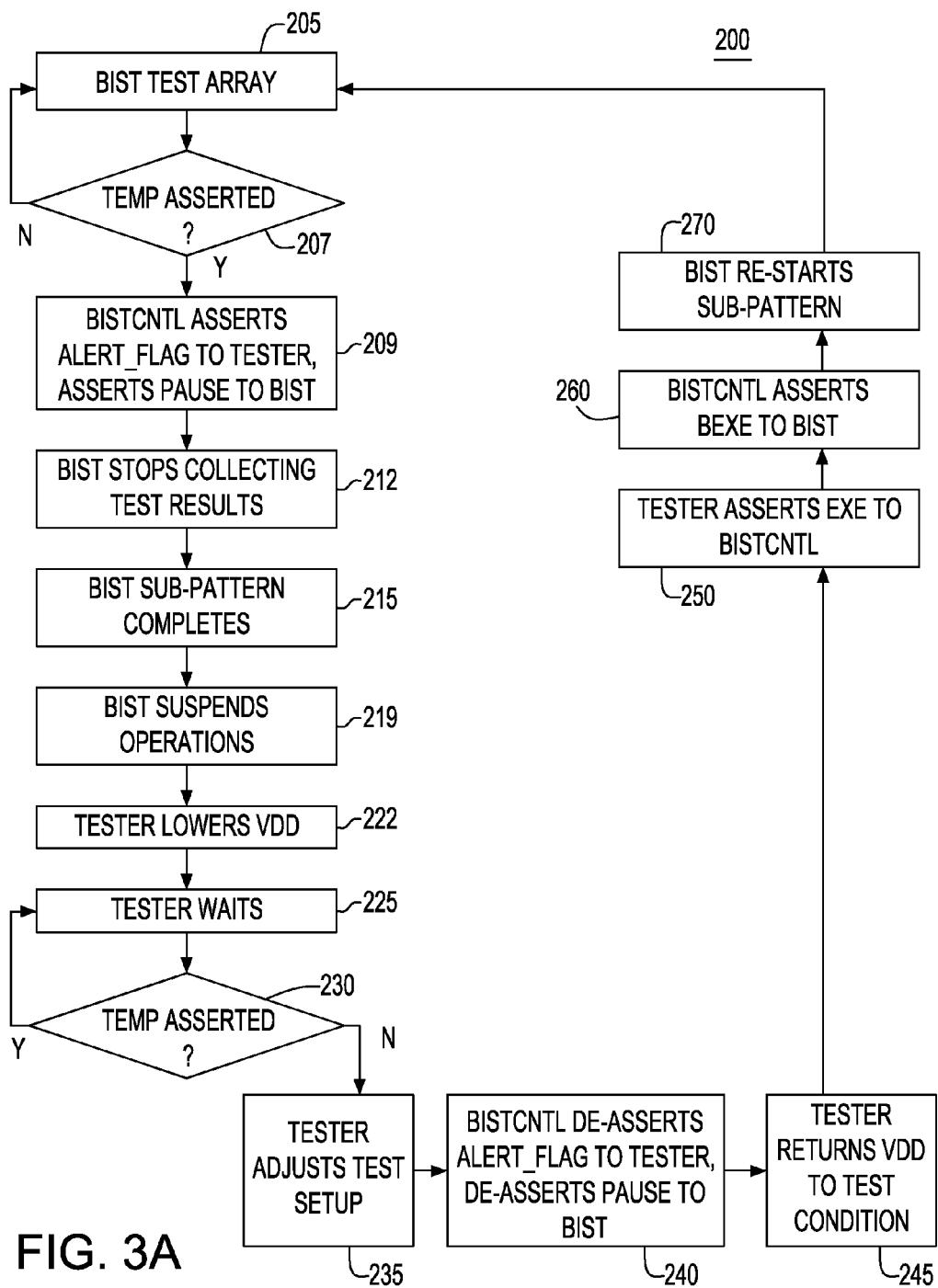
FIGS. 3A and 3B depict BIST test methodologies according to a first embodiment of the invention where test results of suspect circuits are ignored.

FIG. 3A depicts a BIST test methodology 200 according to a first embodiment of the invention where test results of suspect circuits (e.g., memories) are ignored. As shown in FIG. 3A, the BIST test array executes at 205 until a TEMP signal 160 is asserted at 207 in response to the logic applied at the outputs of the one or more on-chip thermal sensor devices 150a, . . . , 150n. Upon receipt of the TEMP signal by BIST/CNTL circuit 120 (FIG. 2), the process proceeds to step 209 which represent the step of BIST/CNTL circuit 120 asserting the ALERT_FLAG 175 to the tester device and further asserting a PAUSE signal 126 to the BIST. In response to receipt of the PAUSE signal 126, BIST testing ceases collecting BIST test results as indicated at 212 until the BIST sub-pattern currently being executed completes as indicated at step 215. At such time, the BIST suspends all operations as indicated at step 219 and the tester device 102 lowers the chip under test's operating power source voltage $V_{DD}$ as indicated at 222. It should be understood that the amount that $V_{DD}$ may be decremented is dependent upon the chip technology implemented, the type of circuits being monitored, the physical size of the components, etc. In a further embodiment, alternatively or in addition to decreasing chip under test's operating power source voltage, other test circuit adjustments may be made to assist in lowering temperature: for example increasing the cooling provided by the tester or reducing or stopping clock switching. Then, after decreasing the chip under test's operating voltage $V_{DD}$ and/or performing other test circuit adjustments at step 222, the Tester circuit monitors TEMP signal at 225 until the TEMP signal de-asserts indicating a return to the normal starting temperature as experienced during previous tests, i.e., a reduction to a more normal BIST operating temperature condition. Until the temperature threshold condition returns to normal as indicated at 230, the Tester will wait at step 225. Once the TEMP signal 160 is de-asserted, the process proceeds to step 235 where the Tester adjusts the test setup by reducing the clock frequency or the number of circuits under test or the test pattern length. Then, as indicated at step 240, in response to the TEMP signal 160 being de-asserted, the BIST/CNTL circuit 120 (FIG. 2) de-asserts the ALERT_FLAG to the Tester 102 and the PAUSE signal is de-asserted to the BIST tester 130. As indicated at step 245, the BIST tester 130 returns $V_{DD}$ to the starting test condition voltage levels. Then, in response to de-asserting the ALERT_

FLAG 175 to the Tester 102 (FIG. 2) the Tester 102 asserts the EXE signal 104 to the BIST/CNTL circuit 120 as indicated at step 250 in FIG. 3A. Continuing to step 260, in response to receipt of the EXE signal 104, the BIST/CNTL circuit 120 asserts the BEXE signal 124 to the BIST 130 and, at 270, the BIST re-starts applying sub-patterns for the BIST test array and the process returns to step 205. Thus, FIG. 3A exemplifies a BIST flow using temperature monitors to maintain consistent test conditions whereby test results are ignored and test array sub-patterns are re-started after temperature correction.

Figure 3B:
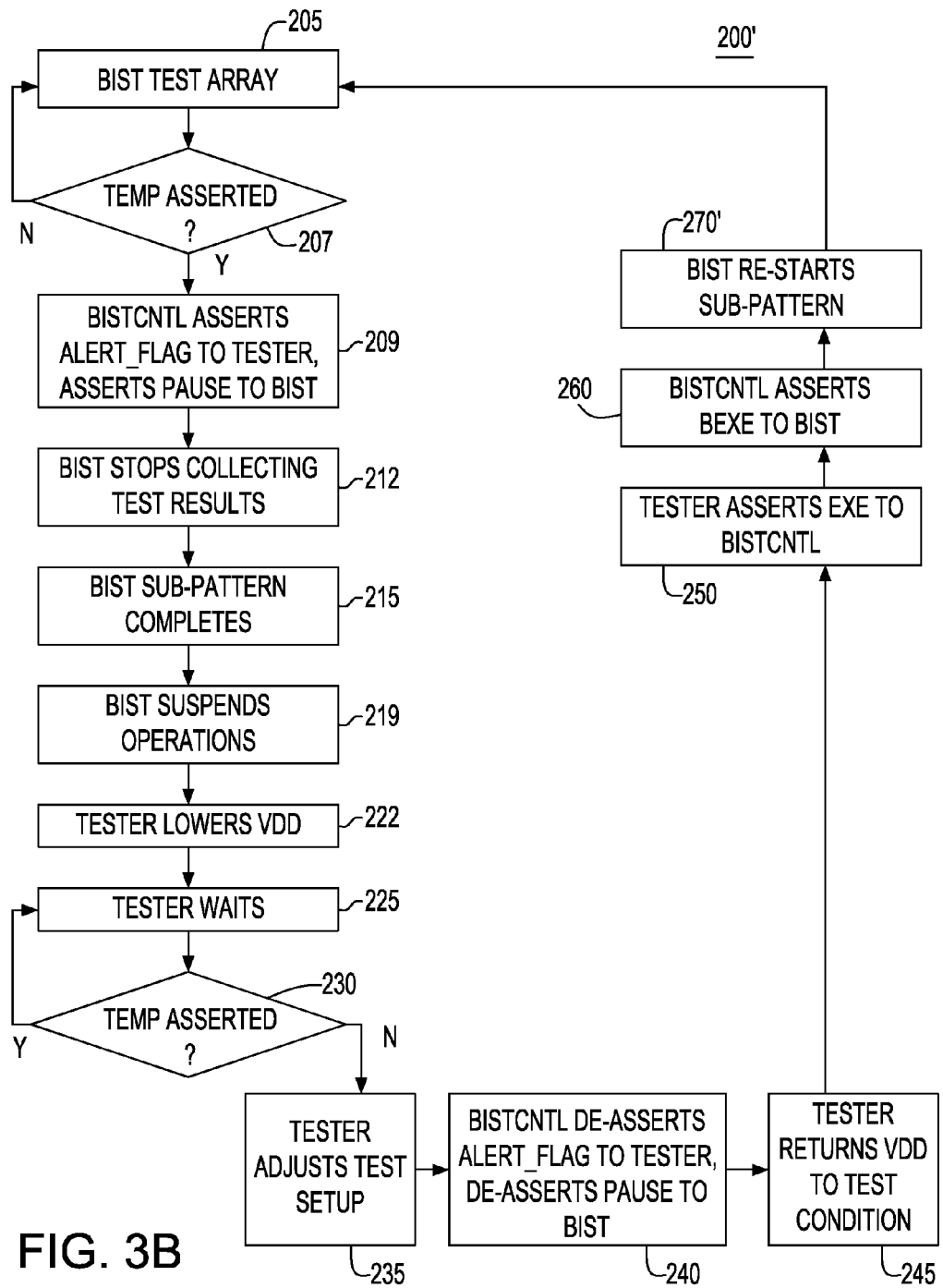

FIG. 3B depicts a BIST test methodology 200' which is a variant of the test methodology applied as described with respect to FIG. 3A. According to the variant test methodology depicted in FIG. 3B, every step is identical as in corresponding FIG. 3A, except for step 270' which depicts the step of starting the next sub-pattern after the sub-pattern completed at step 215 prior to correcting for the temperature condition. Thus in the embodiment depicted in FIG. 3B, the test results of suspect circuits (e.g., memories) are ignored and the sub-patterns skipped after temperature correction.

Thus, it is seen that in the embodiment of the invention directed to ignoring the BIST results (FIGS. 3A, 3B), once the test has completed, the tester has the option of continuing test, either without or while continuing with, test adjustments, i.e., adjust (lower) Vdd (reduce DC power), reduce length of test, reduce AC power by lowering clock frequency, and reduce the number of memories/circuits tested, etc., followed by proceeding to the next sub-pattern (FIG. 3B) or, re-running the beginning of the previous sub-pattern (FIG. 3A).

Figure 4A:
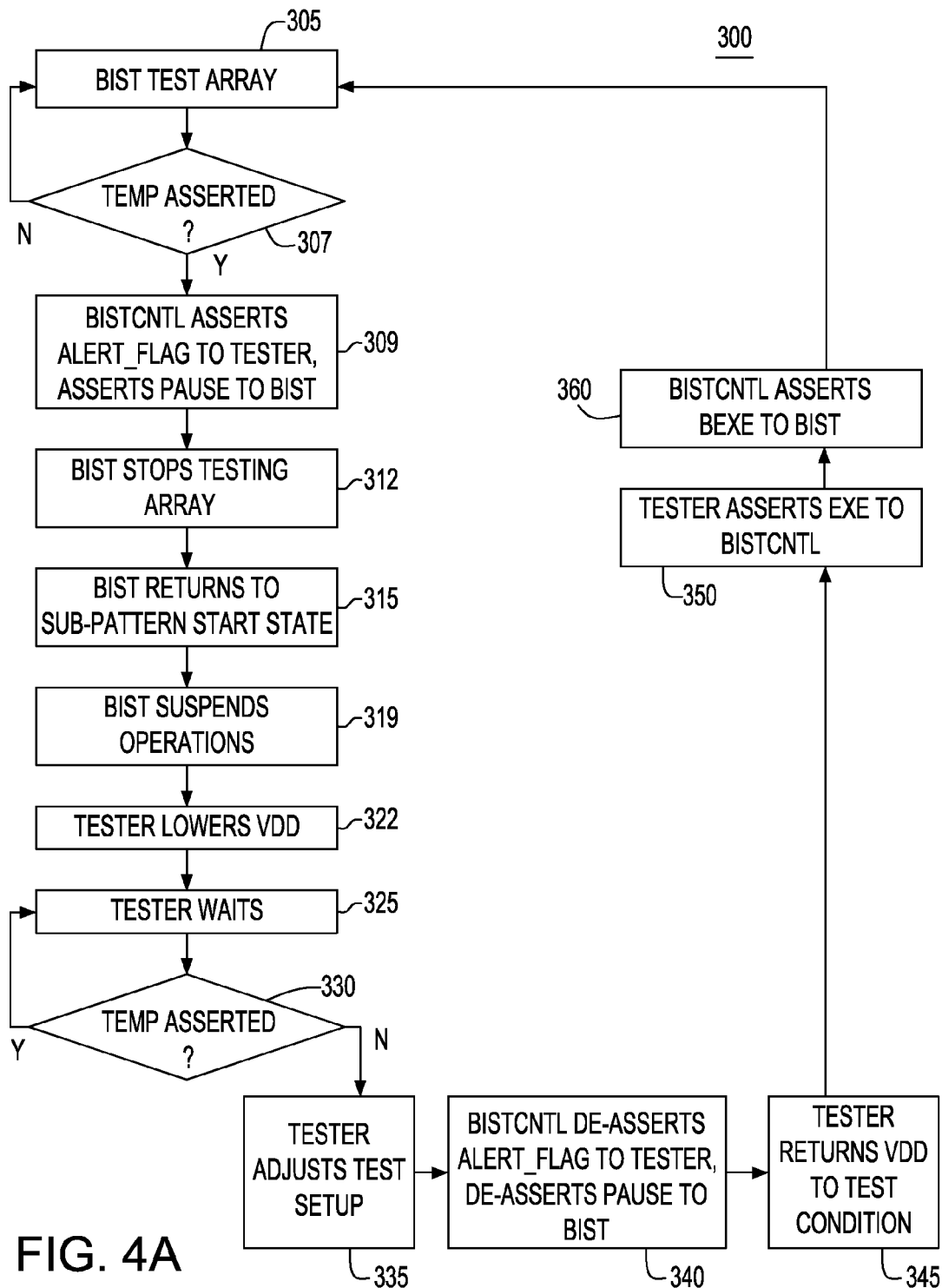
FIGS. 4A-4C depict a BIST test methodologies according to a second embodiment of the invention wherein the testing of suspect circuits (e.g., suspect memories) is temporarily stopped.

FIG. 4A depicts a BIST test methodology 300 according to a second embodiment of the invention wherein the testing of suspect circuits (e.g., suspect memories) is temporarily stopped. As shown in FIG. 4A, the BIST test array executes at 305 until a TEMP signal 160 is asserted at 307 in response to the logic applied at the outputs of the one or more on-chip thermal sensor devices 150a, . . . , 150n. Upon receipt of the TEMP signal by BIST/CNTL circuit 120 (FIG. 2), the process proceeds to step 309 which represent the step of BIST/CNTL circuit 120 asserting the ALERT_FLAG 175 to the tester device and further asserting a PAUSE signal 126 to the BIST. In response to receipt of the PAUSE signal 126, the BIST stops testing the array as indicated at step 312 and returns to the sub-pattern at the initial (start) state at 315. After returning to the sub-pattern at the initial (start) state at 315, the BIST suspends all operations as indicated at step 319 and the tester device 102 lowers the chip under test's operating power source voltage $V_{DD}$ as indicated at 322. As mentioned hereinabove, the amount that $V_{DD}$ may be decremented is dependent upon the chip technology implemented, the type of circuits being monitored, the physical size of the components, etc. In a further embodiment, alternatively or in addition to decreasing chip under test's operating power source voltage, other test circuit adjustments may be made to assist in lowering temperature: for example increasing the cooling provided by the tester or reducing or stopping clock switching. Then, after decreasing the chip under test's power supply voltage $V_{DD}$ and/or performing other test circuit adjustment at step 322, the Tester circuit monitors TEMP signal at 325 until the TEMP signal de-asserts indicating a return to the normal starting temperature as experienced during previous tests, i.e., a reduction to a more normal BIST operating temperature condition. Until the temperature threshold condition returns to normal as indicated at 330, the Tester will wait at step 325. Thus, by causing BIST to enter a wait state, the switching activity of the suspect memories are temporarily disabled. Once the TEMP signal 160 is de-asserted, the process proceeds to step 335 where the Tester adjusts the test setup by reducing the clock frequency or the number of circuits under test or the test pattern length. Then, as indicated at step 340, in response to the TEMP signal 160 being de-asserted, the BIST/CNTL circuit 120 (FIG. 2) de-asserts the ALERT_FLAG to the Tester 102 and the PAUSE signal is de-asserted to the BIST tester 130. As indicated at step 345, the BIST tester 130 returns $V_{DD}$ to the starting test condition voltage levels. Then, in response to de-asserting the ALERT_FLAG 175 to the Tester 102 (FIG. 2) the Tester 102 asserts the EXE signal 104 to the BIST/CNTL circuit 120 as indicated at step 350 in FIG. 4A. Continuing to step 360, in response to receipt of the EXE signal 104, the BIST/CNTL circuit 120 asserts the BEXE signal 124 to the BIST 130 where the BIST re-starts applying sub-patterns for the BIST test array as indicated by the return to step 305. Thus, FIG. 4A exemplifies a BIST flow using temperature monitors to maintain consistent test conditions whereby test array sub-patterns are re-started after temperature correction.

Figure 4B:
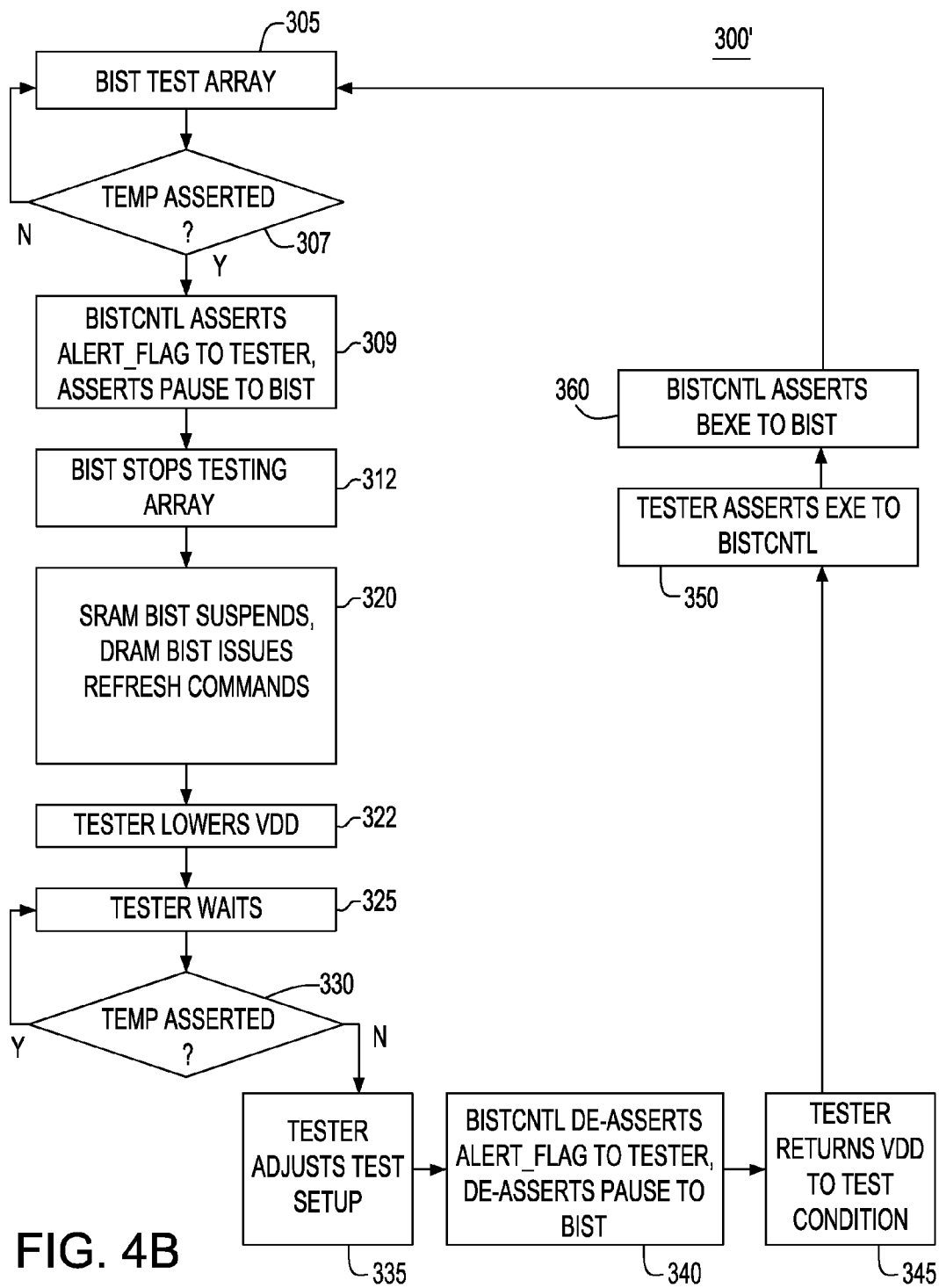

FIG. 4B depicts a BIST test methodology 300' which is a variant of the test methodology applied as described with respect to FIG. 4A and applicable to the testing of SRAM and DRAM types of memory. According to the variant test methodology depicted in FIG. 4B, every step is identical as in corresponding FIG. 4A, except for steps 315 and 319 of FIG. 4A which are omitted according to the method depicted in FIG. 4B and replaced instead with a step 320 directed to the step of suspending SRAM BIST testing, suspending DRAM BIST testing, and, issuing a memory refresh signal to the DRAM under test. After performing step 320, the next steps include: decreasing the chip under test's operating voltage $V_{DD}$ and/or performing other test circuit adjustment at step 322, monitoring by the Tester circuit the TEMP signal at 325 until the TEMP signal de-asserts at step 325 indicating a return to the normal starting temperature as experienced during previous tests, i.e., a reduction to more normal BIST operating temperature condition. Until the temperature threshold condition returns to normal as indicated at 330, the Tester will wait at step 325. Once the TEMP signal 160 is de-asserted, the process proceeds to step 335 where the Tester adjusts the test setup by reducing the clock frequency or the number of circuits under test or the test pattern length. Then, as indicated at step 340, in response to the TEMP signal 160 being de-asserted, the BIST/CNTL circuit 120 (FIG. 2) de-asserts the ALERT_FLAG to the Tester 102 and the PAUSE signal is de-asserted to the BIST tester 130. As indicated at step 345, the BIST tester 130 returns $V_{DD}$ to the starting test condition voltage levels. Then, in response to de-asserting the ALERT_FLAG 175 to the Tester 102 (FIG. 2) the Tester 102 asserts the EXE signal 104 to the BIST/CNTL circuit 120 as indicated at step 350 in FIG. 4B and, continuing to step 360, in response to receipt of the EXE signal 104, the BIST/CNTL circuit 120 asserts the BEXE signal 124 to the BIST 130 where the BIST re-starts applying sub-patterns for the BIST test array as indicated by the return to step 305. Thus, FIG. 4B exemplifies a BIST flow using temperature monitors to maintain consistent test conditions whereby upon detection of a temperature condition failure, both SRAM and DRAM BIST testing is suspended and, a memory refresh signal is applied to the DRAM under test, and, upon returning to normal test temperature conditions, test array sub-patterns are continued from where sub-pattern was interrupted.

Figure 4C:
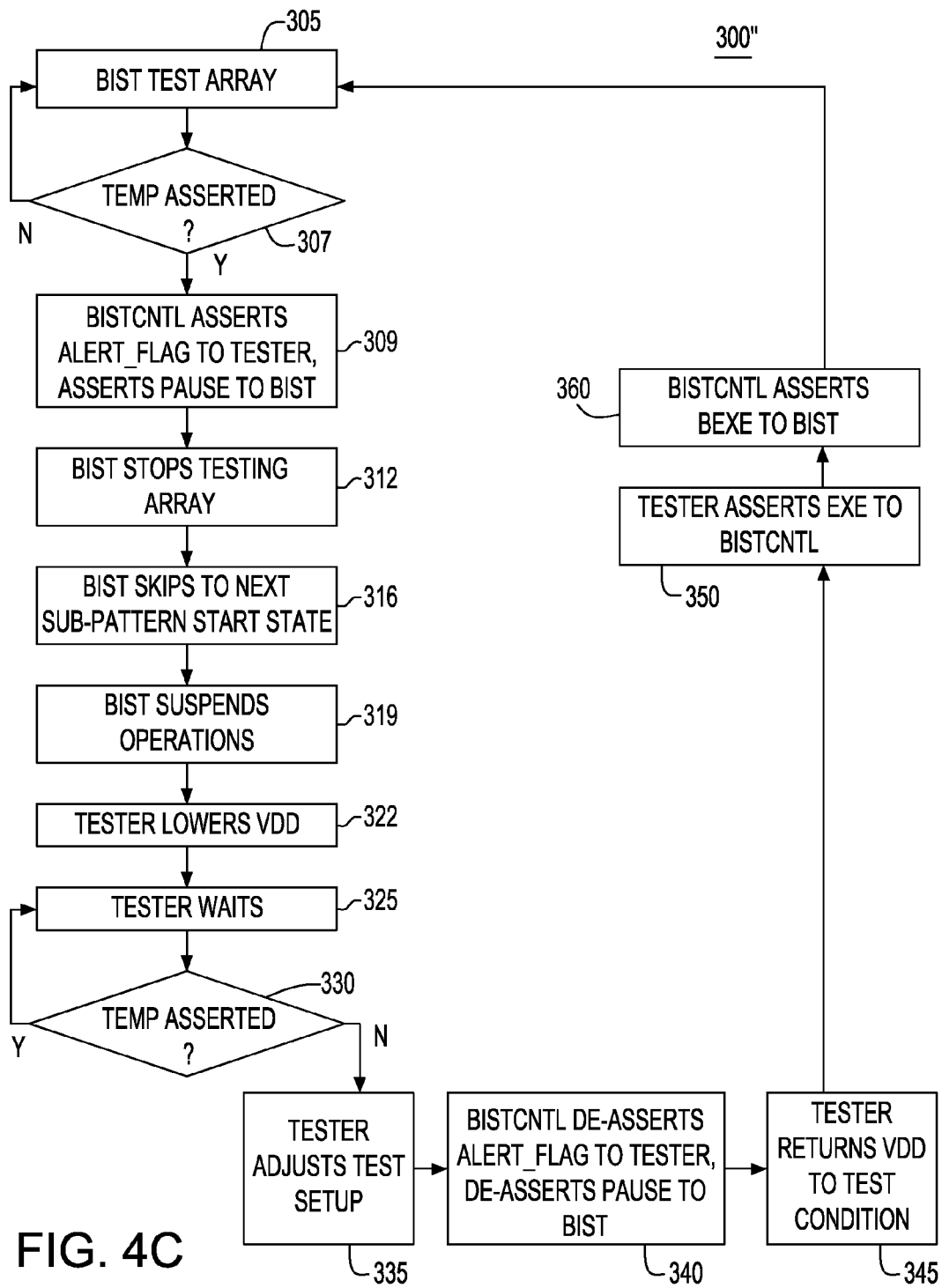

FIG. 4C depicts a BIST test methodology 300" which is a variant of the test methodology applied as described with respect to FIG. 4A. According to the variant test methodology depicted in FIG. 4C, every step is identical as in corresponding FIG. 4A, except for step 315 of FIG. 4A which is omitted according to the method depicted in FIG. 4B and replaced instead with a step 316 directed to the step of skipping to the next BIST test sub-pattern start state. After performing step 316, the next steps include: suspending BIST test operations at 319, decreasing the chip under test's supply voltage $V_{DD}$ and/or performing other test circuit adjustment at step 322, monitoring by the Tester circuit the TEMP signal at 325 until the TEMP signal de-asserts at step 325 indicating a return to the normal starting temperature as experienced during previous tests, i.e., a reduction to more normal BIST operating temperature condition. Until the temperature threshold condition returns to normal as indicated at 330, the Tester will wait at step 325. Once the TEMP signal 160 is de-asserted, the process proceeds to step 335 where the Tester adjusts the test setup by reducing the clock frequency or the number of circuits under test or the test pattern length. Then, as indicated at step 340, in response to the TEMP signal 160 being de-asserted, the BIST/CNTL circuit 120 (FIG. 2) de-asserts the ALERT_FLAG to the Tester 102 and the PAUSE signal is de-asserted to the BIST tester 130. As indicated at step 345, the BIST tester 130 returns VDD to the starting test condition voltage levels. Then, in response to de-asserting the ALERT_FLAG 175 to the Tester 102 (FIG. 2) the Tester 102 asserts the EXE signal 104 to the BIST/CNTL circuit 120 as indicated at step 350 in FIG. 4C and, continuing to step 360, in response to receipt of the EXE signal 104, the BIST/CNTL circuit 120 asserts the BEXE signal 124 to the BIST 130 where the BIST re-starts applying sub-patterns for the BIST test array as indicated by the return to step 305. Thus, FIG. 4C exemplifies a BIST flow using temperature monitors to maintain consistent test conditions whereby upon detection of a temperature condition failure, the method advances to the next BIST sub-pattern start state, which next BIST test sub-pattern is initiated upon returning to normal test temperature conditions.

Thus, it is seen that in the embodiment of the invention directed to temporarily stopping testing of suspect circuits under test (e.g., static and/or dynamic memories) (FIG. 4A-4C), the method for resuming BIST test after the wait state can take one of three forms—the particular sub pattern can be resumed or continued (a valid option for SRAM's and other static memories or a DRAM with automatic refresh) (FIG. 4B), the sub pattern can be restarted (FIG. 4A), or the sub pattern can be skipped entirely (FIG. 4C).

Figure 1:
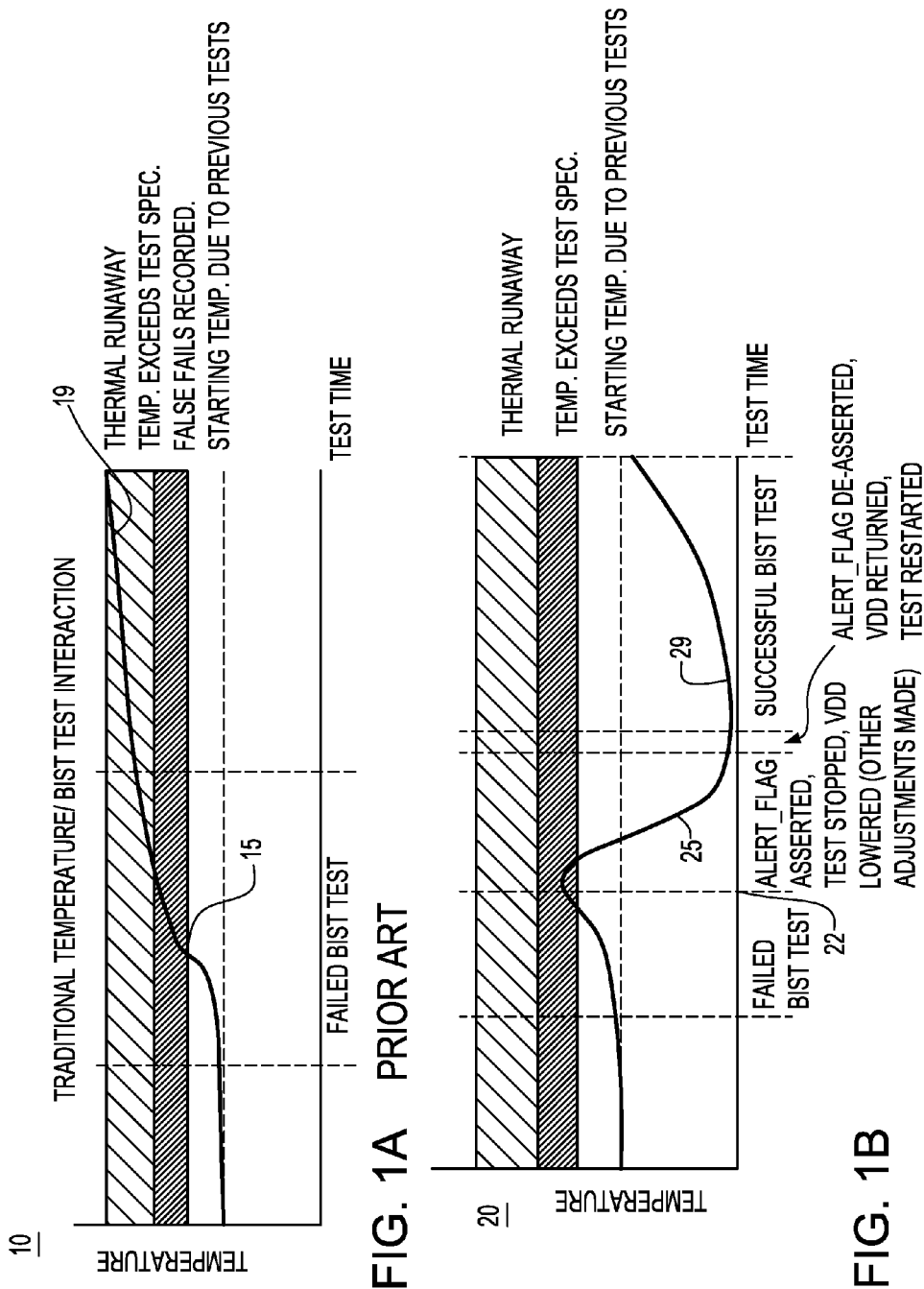
FIG. 1A depicts a plot 10 of the interaction between temperature and BIST test and particularly, the relationship between temperature vs. BIST test time.
FIG. 1B depicts a plot of temperature vs. BIST test time and the resulting BIST test interaction that ensures successful BIST testing according to the invention.

FIG. 1B depicts a plot 20 of the interaction between temperature and BIST test and particularly, the relationship between temperature vs. BIST test time in accordance with the various embodiments of the present invention. As shown in FIG. 1B, after detection of BIST failure due to exceeding a operating temperature specification at 22 (and subsequent assertion of the ALERT_FLAG), the plot 20 shows the decrease in temperature condition 25 as a result of modifying the test conditions (e.g., stopping BIST test, lowering VDD, clock frequency, and/or other adjustments as described herein) and, the plot 29 depicting the resumption of valid BIST testing 29 after the ALERT_FLAG is de-asserted and the BIST testing condition returns to normal (i.e., test setup adjusts, for example, by returning Vdd to normal). As shown in FIG. 1B, a BIST test thermal runaway condition is completely avoided.

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention.

The invention claimed is:

1. A method of controlling a Built-In-Self-Test (BIST) state machine using thermal feedback comprising the steps of:
   providing a thermal sensor device in proximity to a circuit to which BIST testing operations are applied;
   comparing the current temperature value sensed by said thermal sensor to a predetermined temperature threshold;
   determining whether the predetermined temperature threshold is met or exceeded;
   suspending said BIST testing operation in response to meeting or exceeding said predetermined temperature threshold and,
   ignoring BIST test results obtained from said circuit in response to determining that said predetermined temperature threshold has been met or exceeded during BIST testing operation; and
   resuming BIST testing operation when the current temperature value is reduced below said predetermined threshold value.

2. The method of controlling a BIST state machine as claimed in claim 1, wherein said BIST testing operations are applied to a plurality of circuits under test, wherein a thermal sensor device is provided in proximity to each of said plurality of circuits, said method comprising:
   receiving outputs of each of said plurality of circuits and,
   applying logic for determining when a predetermined temperature threshold for a particular circuit has been met or exceeded.

3. The method of controlling a BIST state machine as claimed in claim 2, wherein said suspending of said BIST testing operation includes causing the BIST state machine to enter an idle state.

4. The method of controlling a BIST state machine as claimed in claim 3, wherein during said idle state, adjusting operating parameters of said one or more circuits to reduce temperature at said circuits.

5. The method of controlling a BIST state machine as claimed in claim 4, wherein said adjusting operating parameters includes reducing a DC power supply voltage supplied to said one or more circuits to lower said temperature at said circuits.

6. The method of controlling a BIST state machine as claimed in claim 5, wherein said resuming BIST testing operation includes one of: resuming at a previous DC power supply voltage supplied to said one or more circuits at the time of BIST testing operations or, resuming DC power supply voltage supplied to said one or more circuits at a reduced value during subsequent tests.

7. The method of controlling a BIST state machine as claimed in claim 4, wherein said adjusting includes reducing a clock frequency of a clock signal applied to said one or more circuits subject to BIST testing operations.

8. The method of controlling a BIST state machine as claimed in claim 4, wherein said adjusting includes reducing a number of circuits tested.

9. The method of controlling a BIST state machine as claimed in claim 4, wherein said resuming includes: continuing the BIST test sub pattern from where it was interrupted or re-applying a BIST test sub pattern implemented prior to determining that said predetermined temperature threshold has been met or exceeded during BIST testing operation.

10. The method of controlling a BIST state machine as claimed in claim 4, wherein said resuming includes: foregoing application of a BIST test sub pattern implemented prior to determining that said predetermined temperature threshold has been met or exceeded, and applying a next subsequent sub pattern in said BIST testing operation.

11. The method of controlling a BIST state machine as claimed in claim 1, wherein said suspending of said BIST testing operation includes causing the BIST state machine to enter an idle state.

12. The method of controlling a BIST state machine as claimed in claim 11, wherein during said idle state, adjusting operating parameters of said one or more circuits to reduce temperature at said circuits.

13. The method of controlling a BIST state machine as claimed in claim 12, wherein said adjusting operating parameters includes reducing a DC power supply voltage supplied to said one or more circuits to lower said temperature at said circuits.

14. The method of controlling a BIST state machine as claimed in claim 13, wherein said resuming BIST testing operation includes one of resuming at a previous DC power supply voltage supplied to said one or more circuits at the time of BIST testing operations or, resuming DC power supply voltage supplied to said one or more circuits at a reduced value during subsequent tests.

15. The method of controlling a BIST state machine as claimed in claim 12, wherein said adjusting includes reducing a clock frequency of a clock signal applied to said one or more circuits subject to BIST testing operations.

16. The method of controlling a BIST state machine as claimed in claim 12, wherein said adjusting includes reducing a number of circuits tested.

17. The method of controlling a BIST state machine as claimed in claim 12, wherein said resuming includes: re-applying a BIST test sub pattern implemented prior to determining that said predetermined temperature threshold has been met or exceeded during BIST testing operation.

18. The method of controlling a BIST state machine as claimed in claim 12, wherein said resuming includes: foregoing application of a BIST test sub pattern implemented prior to determining that said predetermined temperature threshold has been met or exceeded, and applying a next subsequent sub pattern in said BIST testing operation.

19. A Built-In-Self-Test (BIST) state machine providing BIST testing operations comprising:

a thermal sensor device located in proximity to a circuit to which BIST testing operations are applied, said thermal sensor device comparing the current temperature value sensed by said thermal sensor to a predetermined temperature threshold and determining whether the predetermined temperature threshold is met or exceeded; and, BIST control means for suspending said BIST testing operation in response to meeting or exceeding said predetermined temperature threshold, ignoring BIST test results obtained from said circuit in response to determining that said predetermined temperature threshold has been met or exceeded during BIST testing operation, and for initiating resumption of BIST testing operations when the current temperature value is reduced below said predetermined threshold value.

\* \* \* \* \*